US012230560B2

(12) United States Patent
Kuo et al.

(10) Patent No.: US 12,230,560 B2
(45) Date of Patent: Feb. 18, 2025

(54) SEMICONDUCTOR PACKAGE STRUCTURE

(71) Applicant: MEDIATEK INC., Hsinchu (TW)

(72) Inventors: Che-Hung Kuo, Hsinchu (TW); Hsing-Chih Liu, Hsinchu (TW); Tai-Yu Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 315 days.

(21) Appl. No.: 17/546,191

(22) Filed: Dec. 9, 2021

(65) Prior Publication Data

US 2022/0223512 A1 Jul. 14, 2022

Related U.S. Application Data

(60) Provisional application No. 63/135,020, filed on Jan. 8, 2021, provisional application No. 63/172,757, filed on Apr. 9, 2021, provisional application No. 63/231,291, filed on Aug. 10, 2021.

(51) Int. Cl.
| | |
|---|---|
| *H01L 23/498* | (2006.01) |
| *H01L 23/48* | (2006.01) |
| *H01L 23/64* | (2006.01) |
| *H01L 25/065* | (2023.01) |

(52) U.S. Cl.
CPC ...... *H01L 23/49833* (2013.01); *H01L 23/481* (2013.01); *H01L 23/642* (2013.01); *H01L 25/0657* (2013.01); *H01L 2225/06541* (2013.01); *H01L 2225/1023* (2013.01); *H01L 2225/107* (2013.01)

(58) Field of Classification Search
CPC ............. H01L 23/49833; H01L 23/481; H01L 23/642; H01L 25/0657; H10B 80/00

USPC ................................ 257/686, 723, 724, 777
See application file for complete search history.

(56) References Cited

U.S. PATENT DOCUMENTS

| | | | |
|---|---|---|---|
| 10,483,211 B2 | 11/2019 | Lin et al. | |
| 10,943,878 B2 | 3/2021 | Lee et al. | |
| 11,538,793 B2* | 12/2022 | Duan | H01L 23/5222 |

(Continued)

FOREIGN PATENT DOCUMENTS

| | | |
|---|---|---|
| KR | 10-2020-0099806 A | 8/2020 |
| TW | 201740521 A | 11/2017 |

(Continued)

OTHER PUBLICATIONS

TW Office Action dated Sep. 13, 2022 in TW application No. 110147816.

(Continued)

*Primary Examiner* — Jasmine J Clark
(74) *Attorney, Agent, or Firm* — McClure, Qualey & Rodack, LLP

(57) ABSTRACT

A semiconductor package structure includes a frontside redistribution layer, a first semiconductor die, a first capacitor, a conductive terminal, and a backside redistribution layer. The first semiconductor die is disposed over the frontside redistribution layer. The first capacitor is disposed over the frontside redistribution layer and electrically coupled to the first semiconductor die. The conductive terminal is disposed below the frontside redistribution layer and electrically coupled to the frontside redistribution layer. The backside redistribution layer is disposed over the first semiconductor die.

19 Claims, 10 Drawing Sheets

(56) References Cited

U.S. PATENT DOCUMENTS

| | | |
|---|---|---|
| 2015/0130041 A1 | 5/2015 | Seo |
| 2016/0021754 A1 | 1/2016 | Chen |
| 2016/0358889 A1 | 12/2016 | Lai |
| 2020/0105738 A1 | 4/2020 | Tseng |
| 2021/0193582 A1* | 6/2021 | Yu ................ H01L 23/5386 |

FOREIGN PATENT DOCUMENTS

| | | |
|---|---|---|
| TW | 202017124 A | 5/2020 |
| TW | 202031106 A | 8/2020 |
| TW | 202101711 A | 1/2021 |

OTHER PUBLICATIONS

German language office action dated Jan. 11, 2024, issued in application No. DE 10 2021 133 785.2.

\* cited by examiner

SEMICONDUCTOR PACKAGE STRUCTURE

CROSS REFERENCE TO RELATED APPLICATIONS

This application claims the benefit of U.S. Provisional Application No. 63/135,020 filed on Jan. 8, 2021, U.S. Provisional Application No. 63/172,757 filed on Apr. 9, 2021, and U.S. Provisional Application No. 63/231,291 filed on Aug. 10, 2021, the entirety of which are incorporated by reference herein.

BACKGROUND OF THE INVENTION

Field of the Invention

The present invention is related to semiconductor packaging technology, and in particular to a semiconductor package structure that includes a capacitor.

Description of the Related Art

With the increase in demand for smaller devices with more functions, three-dimensional integrated circuit (3D IC) package technology, which vertically stacks two or more semiconductor wafers or semiconductor dies, has become increasingly popular. The 3D IC package technology uses interconnect methods such as wire bonding and flip chip to achieve vertical stacks. Thus, in a 3D IC package, the fabrication cost can be reduced, and performance improvements at reduced power and a smaller footprint than conventional two-dimensional (2D) IC package technology can be achieved.

However, although existing semiconductor package structures are generally adequate, they are not satisfactory in every respect. The 3D IC package technology carries new challenges, such as thermal or power delivery network (PDN) design problems. These problems reduce the reliability of the semiconductor package structures. Therefore, further improvements of the semiconductor package structures are required.

BRIEF SUMMARY OF THE INVENTION

Semiconductor package structures are provided. An exemplary embodiment of a semiconductor package structure includes a frontside redistribution layer, a first semiconductor die, a first capacitor, a conductive terminal, and a backside redistribution layer. The first semiconductor die is disposed over the frontside redistribution layer. The first capacitor is disposed over the frontside redistribution layer and electrically coupled to the first semiconductor die. The conductive terminal is disposed below the frontside redistribution layer and electrically coupled to the frontside redistribution layer. The backside redistribution layer is disposed over the first semiconductor die.

Another exemplary embodiment of a semiconductor package structure includes a substrate, a semiconductor die, a bump structure, a molding material, and a capacitor. The substrate has a wiring structure. The semiconductor die is disposed over the substrate and electrically coupled to the wiring structure. The bump structure is adjacent to the first semiconductor die. The molding material surrounds the semiconductor die and the bump structure. The capacitor is disposed over the molding material and is electrically coupled to the semiconductor die through the bump structure and the wiring structure.

Yet another exemplary embodiment of a semiconductor package structure includes a redistribution layer, a multi-capacitor structure, a bottom semiconductor die, and a top semiconductor die. The multi-capacitor structure is disposed below the redistribution layer. The bottom semiconductor die is disposed over the redistribution layer and has a through via, wherein the bottom semiconductor die is electrically coupled to the multi-capacitor structure through the redistribution layer. The top semiconductor die is disposed over the bottom semiconductor die and electrically coupled to the multi-capacitor structure through the through via and the redistribution layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
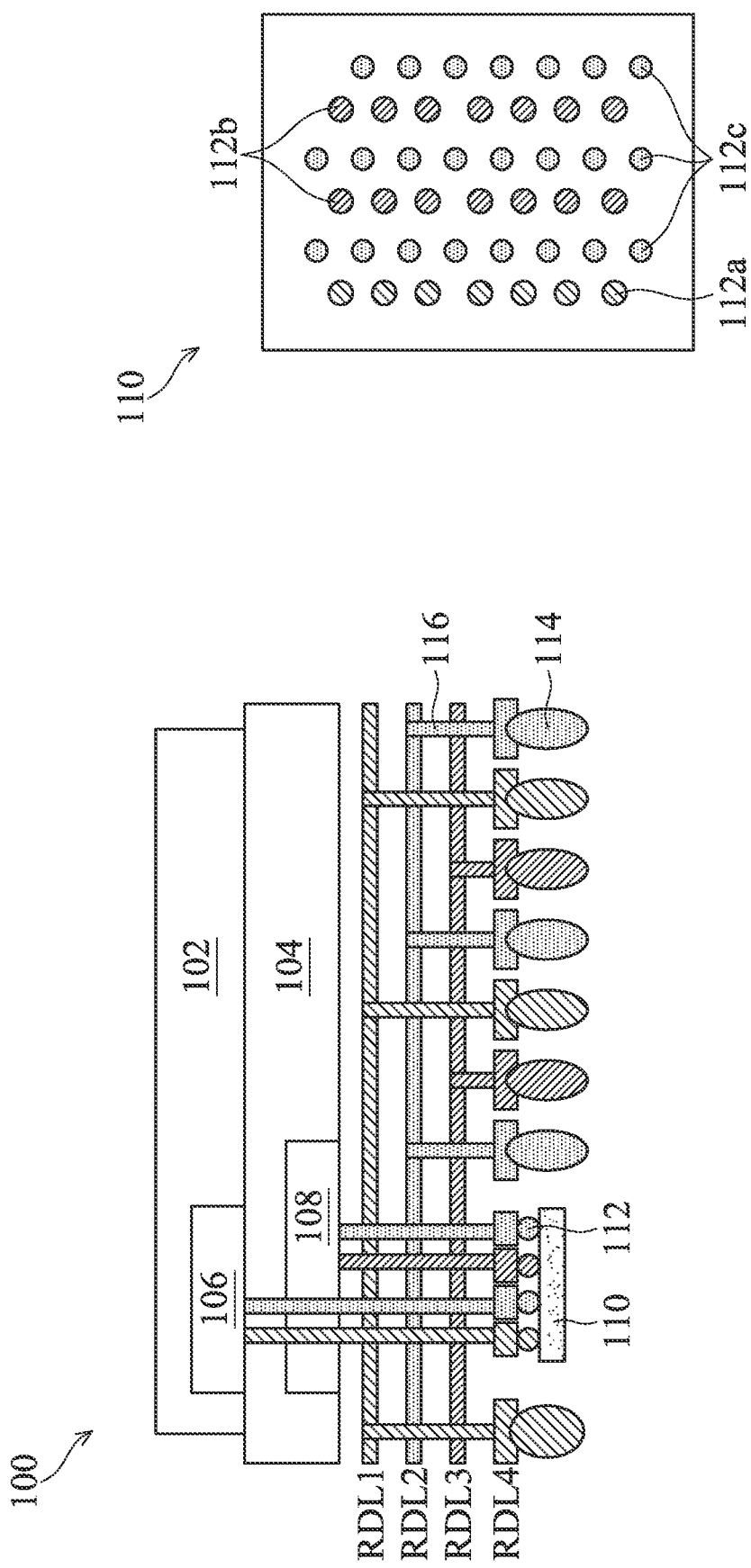
FIG. 1A is a cross-sectional view of an exemplary semiconductor package structure in accordance with some embodiments.
FIG. 1B is a top view of a multi-terminal multi-capacitor structure of an exemplary semiconductor package structure in accordance with some embodiments.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

A semiconductor package structure that includes a capacitor is described in accordance with some embodiments of the present disclosure. In comparison with an embodiment where some of conductive terminals are removed to provide space for the capacitor, the embodiments of the present disclosure can reserve more conductive terminals. Additionally, in some embodiments, the complexity of manufacturing a semiconductor package structure can be reduced.

FIG. 1A is a cross-sectional view of a semiconductor package structure 100 in accordance with some embodiments of the disclosure. Additional features can be added to the semiconductor package structure 100. Some of the features described below can be replaced or eliminated for different embodiments. To simplify the diagram, only a portion of the semiconductor package structure 100 is illustrated.

As shown in FIG. 1A, the semiconductor package structure 100 includes a redistribution layer, which may include a plurality of conductive layers RDL1, RDL2, RDL3, and RDL4, in accordance with some embodiments. Four conductive layers RDL1, RDL2, RDL3, and RDL4 are shown for illustrative purposes only, and there may be more or fewer than four conductive layers.

In some embodiments, the redistribution layer includes a plurality of passivation layers, and the conductive layers RDL1, RDL2, RDL3, and RDL4 are disposed in the passivation layers. The conductive layers RDL1, RDL2, RDL3, and RDL4 may be electrically coupled to each other through a plurality of conductive vias 116 in the passivation layers.

The conductive layers RDL1, RDL2, RDL3, and RDL4 may be formed of metal, such as copper, titanium, tungsten, aluminum, the like, or a combination thereof. The conductive vias 116 may be formed of metal, such as copper, titanium, tungsten, aluminum, the like, or a combination thereof.

In some embodiments, the passivation layers include a polymer layer, for example, polyimide (PI), polybenzoxazole (PBO), benzocyclobutene (BCB), epoxy, the like, or a combination thereof. Alternatively, the passivation layers may include a dielectric layer, such as silicon oxide, silicon nitride, silicon oxynitride, the like, or a combination thereof.

As shown in FIG. 1A, the semiconductor package structure 100 includes a first semiconductor die 102 and a second semiconductor die 104 stacked vertically over the redistribution layer, in accordance with some embodiments. The first semiconductor die 102 and the second semiconductor die 104 may also be referred to as the top semiconductor die 102 and the bottom semiconductor die 104, respectively.

According to some embodiments, the first semiconductor die 102 and the second semiconductor die 104 each independently includes a system-on-chip (SoC) die, a logic device, a memory device, a radio frequency (RF) device, the like, or any combination thereof.

For example, the first semiconductor die 102 and the second semiconductor die 104 may each independently include a micro control unit (MCU) die, a microprocessor unit (MPU) die, a power management integrated circuit (PMIC) die, a global positioning system (GPS) device, an accelerated processing unit (APU) die, a central processing unit (CPU) die, a graphics processing unit (GPU) die, an input-output (IO) die, a dynamic random access memory (DRAM) controller, a static random-access memory (SRAM), a high bandwidth memory (HBM), the like, or any combination thereof.

According to some embodiments, the semiconductor package structure 100 also include one or more passive components (not illustrated), such as resistors, capacitors, inductors, or a combination thereof.

As shown in FIG. 1A, the first semiconductor die 102 may have a XPU core 106, and the second semiconductor die 104 may have a XPU core 108. The XPU core 108 of the second semiconductor die 104 may be electrically coupled to the redistribution layer. The second semiconductor die 104 may have a through via therein. The XPU core 106 of the first semiconductor die 102 may be electrically coupled to the redistribution layer through the through via in the second semiconductor die 104.

As shown in FIG. 1A, the semiconductor package structure 100 includes a multi-terminal multi-capacitor structure 110 disposed below the redistribution layer, in accordance with some embodiments. The multi-terminal multi-capacitor structure 110 may have a plurality of terminals 112, and may be electrically coupled to the first semiconductor die 102 and the second semiconductor die 104 through the redistribution layer and the terminals 112.

The multi-terminal multi-capacitor structure 110 may have more than one capacitor with more than one terminal 112, wherein these capacitors are electrically coupled to the first semiconductor die 102 and the second semiconductor die 104, respectively. That is, the multi-terminal multi-capacitor structure 110 may be a multi-capacitor structure.

In comparison with the embodiment where a semiconductor package structure includes separate capacitors for the first semiconductor die 102 and the second semiconductor die 104, the semiconductor package structure 100 use the multi-terminal multi-capacitor structure 110 for both of the first semiconductor die 102 and the second semiconductor die 104 can reduce the space occupied. In addition, design flexibility can be improved.

As shown in FIG. 1A, the first semiconductor die 102 and the second semiconductor die 104 may overlap the multi-terminal multi-capacitor structure 110 in a direction that is substantially parallel to the stacking direction of the first semiconductor die 102 and the second semiconductor die 104.

In some embodiments, two semiconductor dies, the first semiconductor die 102 and the second semiconductor die 104, share one multi-terminal multi-capacitor structure 110, but the present disclosure is not limit thereto. For example, more than two semiconductor dies may share the multi-terminal multi-capacitor structure 110. Alternatively, more than one multi-terminal multi-capacitor structure may be utilized for a plurality of semiconductor dies.

FIG. 1B is a top view of a multi-terminal multi-capacitor structure 110 of the semiconductor package structure 100 in accordance with some embodiments. As shown in FIG. 1B, the multi-terminal multi-capacitor structure 110 may include a plurality of first terminals 112a, a plurality of second terminals 112b, and a plurality of ground terminals 112c.

The first terminals 112a may be electrically coupled to power terminals of the first semiconductor die 102. The second terminals 112b may be electrically coupled to power terminals of the second semiconductor die 104. The ground terminals 112c may be electrically coupled to ground terminals of the first semiconductor die 102 and the second semiconductor die 104. In particular, the ground terminals of the first semiconductor die 102 and the ground terminals of the second semiconductor die 104 may be connected to each other and be connected to ground. Alternatively, the ground terminals of the first semiconductor die 102 and the ground terminals of the second semiconductor die 104 may be connected to ground separately.

In some embodiments, the first terminals 112a may be arranged along a first line, the second terminals 112b may be arranged along a second line, and the ground terminals 112c may be arranged along a third line. The first line, the second line, and the third line may be parallel to each other.

The ground terminals 112c may be disposed between a column of the first terminals 112a and a column of the second terminals 112b and between two columns of the second terminals 112b. The numbers and arrangements of the first terminals 112a, the second terminals 112b, and the ground terminals 112c shown in the figures are exemplary only and are not intended to limit the present disclosure. For example, the first terminals 112a may be arranged along two lines, and the ground terminals 112c may be disposed between two columns of the first terminals 112a.

Referring back to FIG. 1A, the semiconductor package structure 100 includes a plurality of conductive terminals 114 disposed below the redistribution layer and adjacent to the multi-terminal multi-capacitor structure 110, in accordance with some embodiments. That is, the multi-terminal multi-capacitor structure 110 may be disposed between the conductive terminals 114.

The conductive terminals 114 may be electrically coupled to the redistribution layer. In some embodiments, the conductive terminals 114 are formed of conductive materials, such as metal. The conductive terminals 114 may include microbumps, controlled collapse chip connection (C4) bumps, solder balls, ball grid array (BGA) balls, the like, or a combination thereof.

As shown in FIG. 1A, the multi-terminal multi-capacitor structure 110 may occupy area of the conductive terminals 114. In addition, since the first semiconductor die 102 and the second semiconductor die 104 are stacked vertically and share same projection area resource, the number of available conductive terminals 114 underneath the first semiconductor die 102 and the second semiconductor die 104 may be fewer than semiconductor dies which are disposed side-by-side.

These issues increase the difficulty of integrating separate capacitors for different semiconductor dies as the increasing demand for more functions and smaller devices. In view of this, the semiconductor package structure 100 according to the present disclosure adopts the multi-terminal multi-capacitor structure 110 instead of separate capacitors, occupied area of capacitors can be reduced, and more conductive terminals 114 can be remained.

Figure 2:
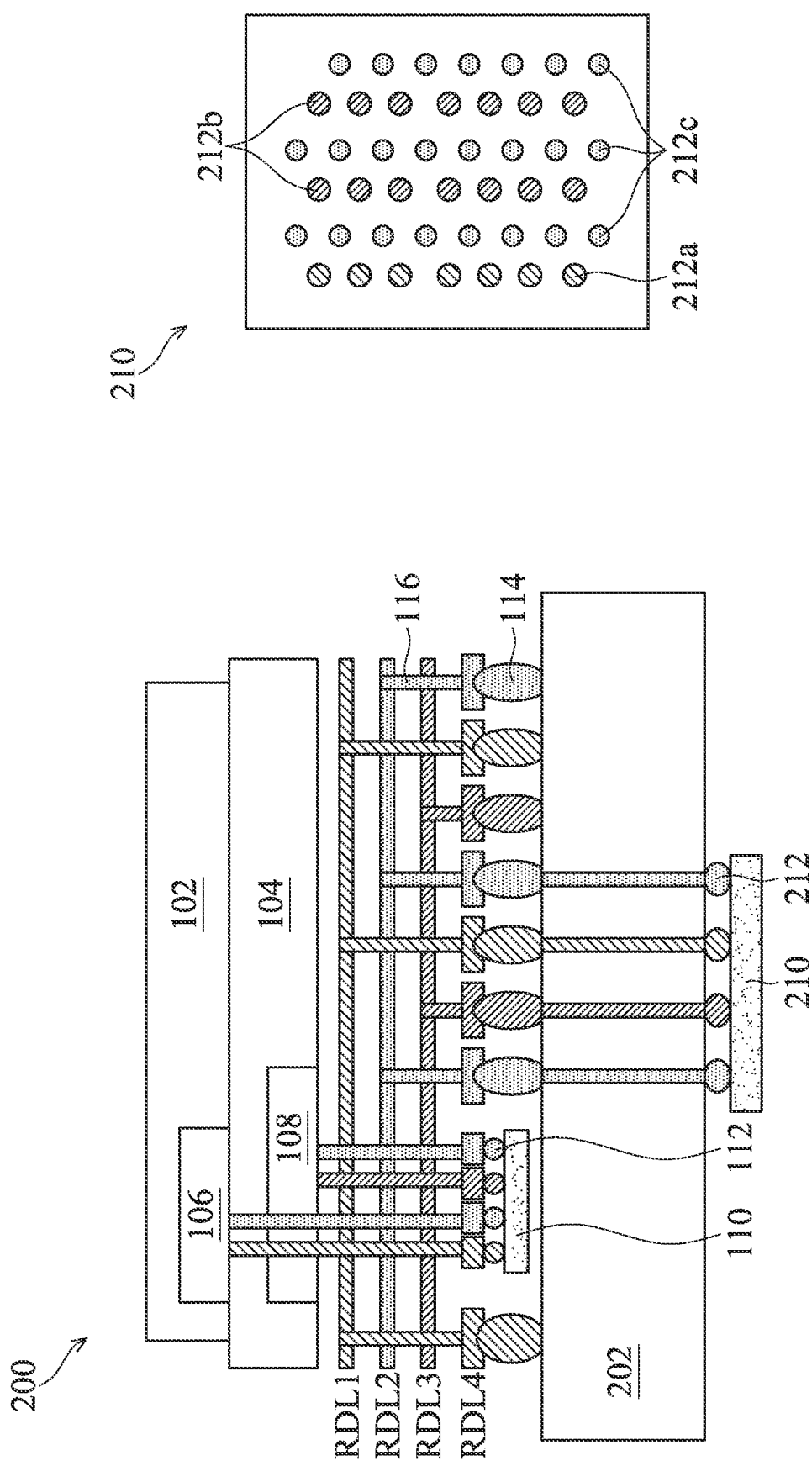
FIG. 2A is a cross-sectional view of an exemplary semiconductor package structure in accordance with some embodiments.
FIG. 2B is a top view of a multi-terminal multi-capacitor structure of an exemplary semiconductor package structure in accordance with some embodiments.

FIG. 2A is a cross-sectional view of a semiconductor package structure 200, in accordance with some embodiments of the disclosure. It should be noted that the semiconductor package structure 200 may include the same or similar components as that of the semiconductor package structure 100, which is illustrated in FIG. 1A, and for the sake of simplicity, those components will not be discussed in detail again. In the following embodiments, a multi-terminal multi-capacitor structure is disposed below a substrate.

As shown in FIG. 2A, the semiconductor package structure 200 includes a substrate 202, in accordance with some embodiments. The substrate 202 may have a wiring structure therein. In some embodiments, the wiring structure in the substrate 202 includes conductive layers, conductive vias, conductive pillars, the like, or a combination thereof. The wiring structure in the substrate 202 may be formed of metal, such as copper, aluminum, the like, or a combination thereof.

The wiring structure in the substrate 202 may be disposed in inter-metal dielectric (IMD) layers. In some embodiments, the IMD layers may be formed of organic materials, such as a polymer base material, non-organic materials, such as silicon nitride, silicon oxide, silicon oxynitride, the like, or a combination thereof. The substrate 202 may include an insulating core, such as a fiberglass reinforced resin core, to prevent the substrate 202 from warpage.

It should be noted that the configuration of the substrate 202 shown in the figures is exemplary only and is not intended to limit the present disclosure. Any desired semiconductor element may be formed in and on the substrate 202. However, in order to simplify the diagram, only the flat substrate 202 is illustrated.

As shown in FIG. 2A, the semiconductor package structure 200 includes a multi-terminal multi-capacitor structure 210 disposed below the substrate 202, in accordance with some embodiments. The multi-terminal multi-capacitor structure 210 may have a plurality of terminals 212, and be electrically coupled to the first semiconductor die 102 and the second semiconductor die 104 through the redistribution layer, the conductive terminals 114, the wiring structure in the substrate 202, and the terminals 212.

The multi-terminal multi-capacitor structure 210 may have more than one capacitor with more than one terminal 212, wherein these capacitors are electrically coupled to the first semiconductor die 102 and the second semiconductor die 104, respectively. That is, the multi-terminal multi-capacitor structure 210 may be a multi-capacitor structure.

As mentioned above, the semiconductor package structure 200 use the multi-terminal multi-capacitor structure 210 for both of the first semiconductor die 102 and the second semiconductor die 104 can reduce the space occupied and improve design flexibility, in accordance with some embodiments.

FIG. 2B is a top view of a multi-terminal multi-capacitor structure 210 of the semiconductor package structure 200 in accordance with some embodiments. As shown in FIG. 2B, the multi-terminal multi-capacitor structure 210 may include a plurality of first terminals 212a, a plurality of second terminals 212b, and a plurality of ground terminals 212c.

The first terminals 212a may be electrically coupled to power terminals of the first semiconductor die 102. The second terminals 212b may be electrically coupled to power terminals of the second semiconductor die 104. The ground terminals 212c may be electrically coupled to ground terminals of the first semiconductor die 102 and the second semiconductor die 104. In particular, the ground terminals of the first semiconductor die 102 and the ground terminals of the second semiconductor die 104 may be connected to each other and be connected to ground. Alternatively, the ground terminals of the first semiconductor die 102 and the ground terminals of the second semiconductor die 104 may be connected to ground separately.

The first terminals 212a, the second terminals 212b, and the ground terminals 212c may be similar to the first terminals 112a, the second terminals 112b, and the ground terminals 112c as shown in FIG. 1B, and will not be repeated.

Referring back to FIG. 2A, the semiconductor package structure 200 may also include a multi-terminal multi-capacitor structure 110 disposed between the substrate 202 and the redistribution layer. The multi-terminal multi-capacitor structure 110 may be similar to the multi-terminal multi-capacitor structure 110 as shown in FIG. 1A, and will not be repeated. The multi-terminal multi-capacitor structure 110 is optional. In some other embodiments, the multi-terminal multi-capacitor structure 110 is replaced with the conductive terminals 114.

Figure 3:
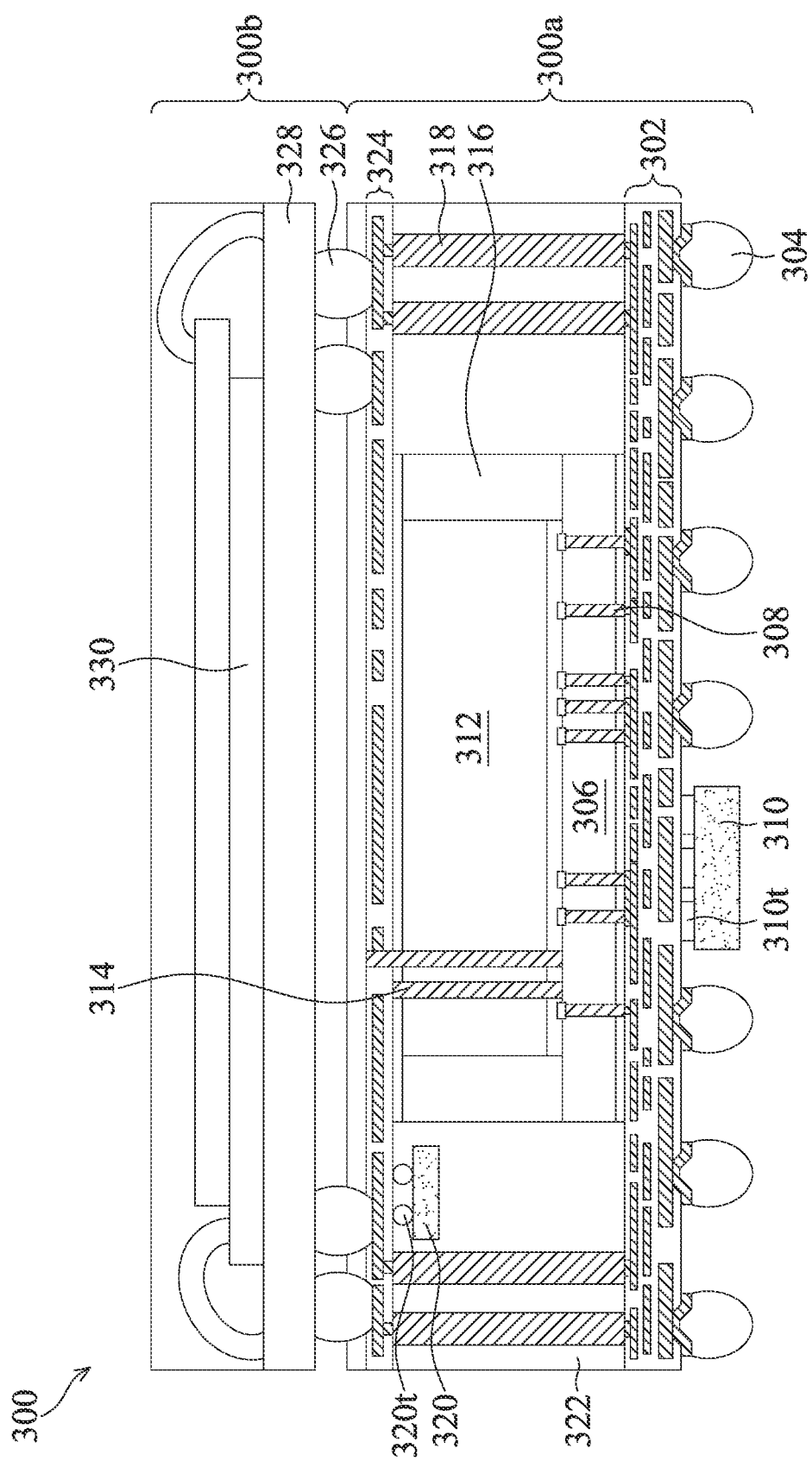
FIG. 3 is a cross-sectional view of an exemplary semiconductor package structure in accordance with some embodiments.

FIG. 3 is a cross-sectional view of a semiconductor package structure 300, in accordance with some embodiments of the disclosure. It should be noted that the semiconductor package structure 300 may include the same or similar components as that of the semiconductor package structure 100, which is illustrated in FIG. 1A, and for the sake of simplicity, those components will not be discussed in detail again. In the following embodiments, a capacitor is disposed on a backside redistribution layer to remain more conductive terminals on a frontside redistribution layer.

As shown in FIG. 3, the semiconductor package structure 300 includes a first package structure 300a and a second package structure 300b stacked vertically, in accordance with some embodiments. The first package structure 300a may have a frontside and a backside opposite to the frontside. In some embodiments, the first package structure 300a has a frontside redistribution layer 302 disposed on the frontside and a backside redistribution layer 324 disposed on the backside.

The frontside redistribution layer 302 may include one or more conductive layers and passivation layers, wherein the conductive layers may be disposed in the passivation layers. The conductive layers may include metal, such as copper, titanium, tungsten, aluminum, the like, or a combination thereof.

In some embodiments, the passivation layers include a polymer layer, for example, polyimide (PI), polybenzoxazole (PBO), benzocyclobutene (BCB), epoxy, the like, or a combination thereof. Alternatively, the passivation layers may include a dielectric layer, such as silicon oxide, silicon nitride, silicon oxynitride, the like, or a combination thereof. The material of the backside redistribution layer 324 may be similar to the material of the frontside redistribution layer 302, and will not be repeated.

As shown in FIG. 3, the frontside redistribution layer 302 includes more conductive layers and passivation layers than the backside redistribution layer 324, in accordance with some embodiments. The frontside redistribution layer 302 may be thicker than the backside redistribution layer 324, but the present disclosure is not limit thereto. For example, the backside redistribution layer 324 may be thicker than or substantially equal to the frontside redistribution layer 302.

As shown in FIG. 3, the first package structure 300a includes a plurality of conductive terminals 304 disposed below the frontside redistribution layer 302 and electrically coupled to the frontside redistribution layer 302, in accordance with some embodiments. The conductive terminals 304 may be formed of conductive materials, such as metal. The conductive terminals 304 may include microbumps, controlled collapse chip connection (C4) bumps, solder balls, ball grid array (BGA) balls, the like, or a combination thereof.

As shown in FIG. 3, the first package structure 300a includes a first semiconductor die 312 and a second semiconductor die 306 stacked vertically over the frontside redistribution layer 302, in accordance with some embodiments. In some embodiments, the first semiconductor die 312 and the second semiconductor die 306 each independently includes a system-on-chip (SoC) die, a logic device, a memory device, a radio frequency (RF) device, the like, or any combination thereof.

For example, the first semiconductor die 312 and the second semiconductor die 306 may each independently include a micro control unit (MCU) die, a microprocessor unit (MPU) die, a power management integrated circuit (PMIC) die, a global positioning system (GPS) device, an accelerated processing unit (APU) die, a central processing unit (CPU) die, a graphics processing unit (GPU) die, an input-output (IO) die, a dynamic random access memory (DRAM) controller, a static random-access memory (SRAM), a high bandwidth memory (HBM), the like, or any combination thereof.

Although two semiconductor dies, the first semiconductor die 312 and the second semiconductor die 306, are shown in FIG. 3, there may be one or more than two semiconductor dies. For example, the first package structure 300a may include three semiconductor dies stacked vertically. Alternatively, the first package structure 300a may include four semiconductor dies, wherein two of them are stacked vertically over a semiconductor die, and the other semiconductor die is disposed over the semiconductor die and adjacent to the two semiconductor dies.

In some embodiments, the first package structure 300a also includes one or more passive components (not illustrated) adjacent to the first semiconductor die 312 and/or the second semiconductor die 306, such as resistors, capacitors, inductors, the like, or a combination thereof.

In some embodiments, the second semiconductor die 306 includes a plurality of through vias 308, which are electrically coupled to the frontside redistribution layer 302. The through vias 308 may be formed of metal, such as copper, tungsten, the like, or a combination thereof. As shown in FIG. 3, the through vias 308 may have substantially vertical sidewalls and may extend from the top surface of the second semiconductor die 306 to the bottom surface of the second semiconductor die 306, but the present disclosure is not limit thereto. The through vias 308 may have other configurations and numbers.

In some embodiments, the first semiconductor die 312 includes a plurality of through vias 314, which are electrically coupled to the backside redistribution layer 324. The through vias 314 may be formed of metal, such as copper, tungsten, the like, or a combination thereof. As shown in FIG. 3, the through vias 314 may have substantially vertical sidewalls and may extend from the top surface of the first semiconductor die 312 to the bottom surface of the first semiconductor die 312, but the present disclosure is not limit thereto. The through vias 314 may have other configurations and numbers.

As shown in FIG. 3, the first package structure 300a includes a capacitor 310 disposed below the frontside redistribution layer 302 and electrically coupled to the frontside redistribution layer 302, in accordance with some embodiments. The capacitor 310 may be disposed between the conductive terminals 314. The capacitor 310 may have a plurality of terminals 310t, and may be electrically coupled to the frontside redistribution layer 302 through the terminals 310t.

In some other embodiments, the capacitor 310 is a multi-capacitor structure, such as the multi-terminal multi-capacitor structure 110 as shown in FIG. 1A, and the details will not be repeated. In these embodiments, the capacitor 310 may be electrically coupled to the first semiconductor die 312 through the frontside redistribution layer 302 and the through vias 308 in the second semiconductor die 306, and may be electrically coupled to the second semiconductor die 306 through the frontside redistribution layer 302.

As shown in FIG. 3, the first package structure 300a includes a molding material 316 surrounding the first semiconductor die 312, in accordance with some embodiments. The molding material 316 may cover the top surface of the second semiconductor die 306 and may adjoin the sidewalls of the first semiconductor die 312. The molding material 316 may protect the first semiconductor die 312 from the environment, thereby preventing the first semiconductor die 312 from damage due to, for example, the stress, the chemicals and/or the moisture.

The molding material 316 may include a nonconductive material, such as a moldable polymer, an epoxy, a resin, the like, or a combination thereof. In some embodiments, the molding material 316 is applied in liquid or semi-liquid form, and then is cured through any suitable curing process, such as a thermal curing process, a UV curing process, the like, or a combination thereof. The molding material 316 may be shaped or molded with a mold (not shown).

Then, the molding material 316 may be partially removed by a planarization process, such as chemical mechanical polishing (CMP), until the top surface of the first semiconductor die 312 is exposed. In some embodiments, the top surface of the molding material 316 and the top surface of the first semiconductor die 312 are substantially coplanar. As shown in FIG. 3, the sidewalls of the molding material 316 may be substantially coplanar with the sidewalls of the second semiconductor die 306.

As shown in FIG. 3, the first package structure 300a includes a plurality of conductive pillars 318 adjacent to the first semiconductor die 312, the second semiconductor die 306, and the molding material 316, in accordance with some embodiments of the disclosure. The conductive pillars 318 may be formed of metal, such as copper, tungsten, the like, or a combination thereof. In some embodiments, the conductive pillars 318 are formed by a plating process or any other suitable process.

As shown in FIG. 3, the conductive pillars 318 may have substantially vertical sidewalls. The conductive pillars 318 may be disposed between the frontside redistribution layer 302 and the backside redistribution layer 324, and may be electrically coupled the frontside redistribution layer 302 to the backside redistribution layer 324.

The configuration of the conductive pillars 318 shown in the figures is exemplary only and is not intended to limit the present disclosure. For example, the number of conductive pillars 318 may be different on opposite sides of the first semiconductor die 312 and the second semiconductor die 306. Alternatively, the conductive pillars 318 may be disposed on one side of the first semiconductor die 312 and the second semiconductor die 306.

As shown in FIG. 3, the first package structure 300a includes a molding material 322 surrounding the first semiconductor die 312, the second semiconductor die 306, the molding material 316, and the conductive pillars 318, in accordance with some embodiments. The molding material 322 may adjoin the sidewalls of the second semiconductor die 306 and the molding material 316, and may cover the top surface of the frontside redistribution layer 302 and the bottom surface of the backside redistribution layer 324.

As shown in FIG. 3, the molding material 322 may fill in gaps between the conductive pillars 318, and between the first semiconductor die 312 and the second semiconductor die 306 and the conductive pillars 318. The molding material 322 may protect the first semiconductor die 312, the second semiconductor die 306, and the conductive pillars 318 from the environment, thereby preventing these components from damage due to, for example, the stress, the chemicals and/or the moisture.

In some embodiments, the molding material 322 includes a nonconductive material, such as a moldable polymer, an epoxy, a resin, the like, or a combination thereof. In some embodiments, the molding material 322 is applied in liquid or semi-liquid form, and then is cured through any suitable curing process, such as a thermal curing process, a UV curing process, the like, or a combination thereof. The molding material 322 may be shaped or molded with a mold (not shown).

Then, the molding material 322 may be partially removed by a planarization process, such as chemical mechanical polishing (CMP), until the top surfaces of the conductive pillars 318 are exposed. In some embodiments, the top surface of the molding material 322 and the top surfaces of the conductive pillars 318 are substantially coplanar. As shown in FIG. 3, the sidewalls of the molding material 322 may be substantially coplanar with the sidewalls of the frontside redistribution layer 302 and the sidewalls of the backside redistribution layer 324. In some other embodiments, the molding material 316 may be omitted, and the molding material 322 may adjoin the sidewalls of the first semiconductor die 312.

As shown in FIG. 3, the backside redistribution layer 324 is disposed over the first semiconductor die 312, in accordance with some embodiments. The backside redistribution layer 324 may cover the top surface of the first semiconductor die 312, the top surface of the molding material 316, the top surfaces of the conductive pillars 318, and the top surface of the molding material 322.

As shown in FIG. 3, the first package structure 300a includes a capacitor 320 disposed below the backside redistribution layer 324 and surrounded by the molding material 322, in accordance with some embodiments. The capacitor 320 may be disposed between the conductive pillars 318 and the first semiconductor die 312.

As shown in FIG. 3, the capacitor 320 may be in contact with the backside redistribution layer 324 and spaced apart from the frontside redistribution layer 302 by the molding material 322. The capacitor 320 may have a plurality of terminals 320t, and may be electrically coupled to the first semiconductor die 312 through the terminals 320t, the backside redistribution layer 324, and the through vias 314.

In comparison with the semiconductor package structure having land-side capacitors, the semiconductor package structure 300 according to the present disclosure having the capacitor 320 which does not occupy the space of the conductive terminals 304, and the design flexibility can be increased.

In some other embodiments, the capacitor 320 is a multi-capacitor structure, such as the multi-terminal multi-capacitor structure 110 as shown in FIG. 1A, and the details will not be repeated. In these embodiments, the capacitor 320 may be electrically coupled to the first semiconductor die 312, and may also be electrically coupled to the second semiconductor die 306 through the terminals 320t, the backside redistribution layer 324, the through vias 314 in the first semiconductor die 312, and the through vias 308 in the second semiconductor die 306.

In the embodiments where the capacitor 310 is a multi-capacitor structure which is electrically coupled the first semiconductor die 312 and the second semiconductor die 306, the capacitor 320 may be omitted. Similarly, in the embodiments where the capacitor 320 is a multi-capacitor structure which is electrically coupled the first semiconductor die 312 and the second semiconductor die 306, the capacitor 310 may be replaced with the conductive terminals 304.

Alternatively, in some embodiments, at least one of the capacitor 310 and the capacitor 320 is a multi-capacitor structure, and the first package structure 300a may include more than two semiconductor dies which may be electrically coupled to the capacitor 310 and the capacitor 320.

As shown in FIG. 3, the second package structure 300b is disposed over the first package structure 300a and is electrically coupled to the backside redistribution layer 324 through a plurality of conductive terminals 326, in accordance with some embodiments. The conductive terminals 326 may be formed of conductive materials, such as metal. In some embodiments, the conductive terminals 326 include microbumps, controlled collapse chip connection (C4) bumps, solder balls, ball grid array (BGA) balls, the like, or a combination thereof.

As shown in FIG. 3, the second package structure 300b includes a substrate 328, in accordance with some embodiments. The substrate 328 may have a wiring structure therein. In some embodiments, the wiring structure of the substrate 328 includes conductive layers, conductive vias, conductive pillars, the like, or a combination thereof. The wiring structure of the substrate 328 may be formed of metal, such as copper, titanium, tungsten, aluminum, the like, or a combination thereof.

The wiring structure of the substrate 328 may be disposed in inter-metal dielectric (IMD) layers. In some embodiments, the IMD layers may be formed of organic materials, such as a polymer base material, a non-organic material, such as silicon nitride, silicon oxide, silicon oxynitride, the like, or a combination thereof. Any desired semiconductor element may be formed in and on the substrate 328. However, in order to simplify the diagram, only the flat substrate 328 is illustrated.

As shown in FIG. 3, the second package structure 300b includes semiconductor components 330 disposed over the substrate 328, in accordance with some embodiments. The semiconductor components 330 may include the same or different devices. For example, the semiconductor components 330 may include memory dies, such as a dynamic random access memory (DRAM). In some embodiments, the second package structure 300b also includes one or more passive components (not illustrated), such as resistors, capacitors, inductors, the like, or a combination thereof.

Figure 4:
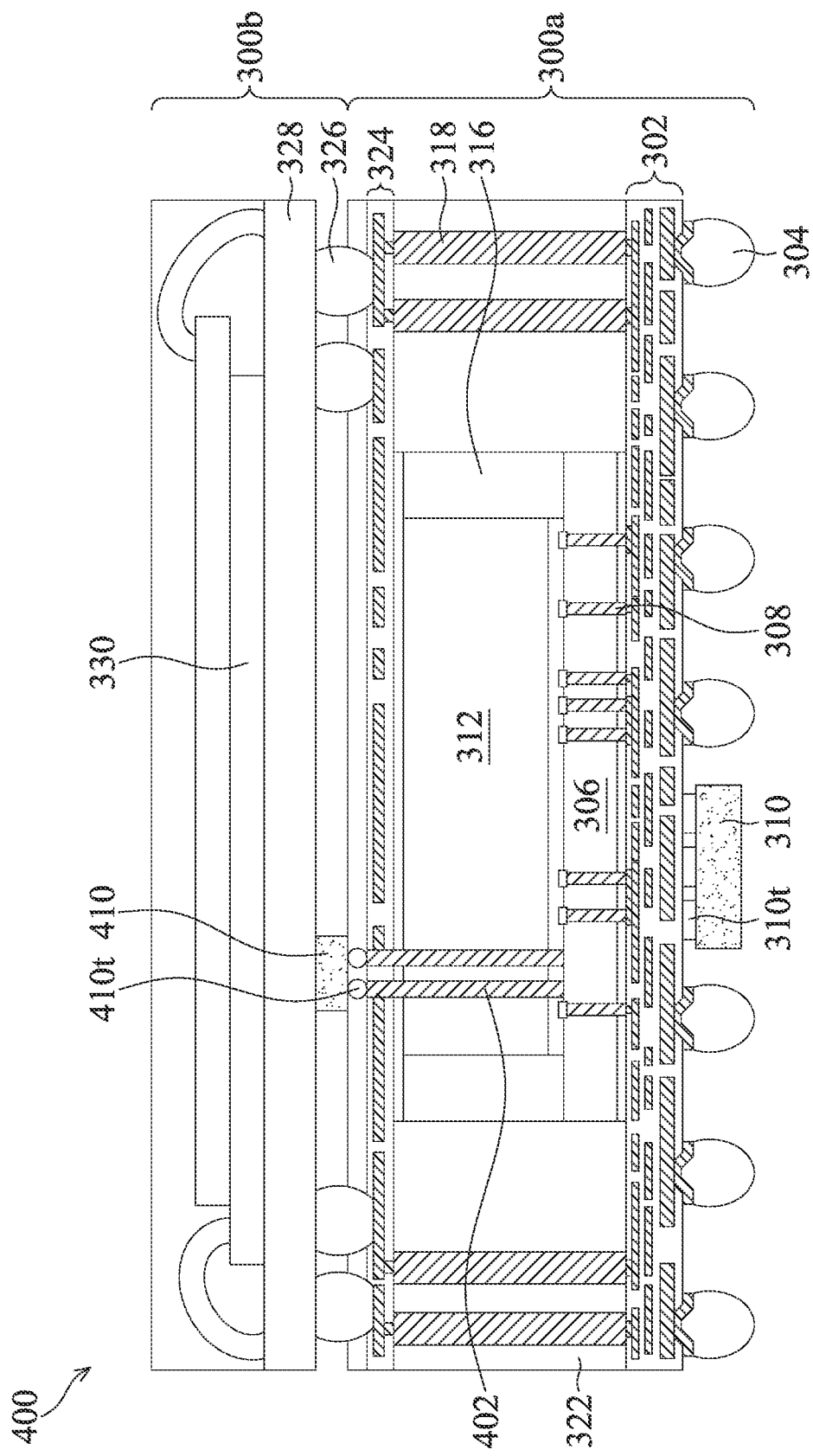
FIG. 4 is a cross-sectional view of an exemplary semiconductor package structure in accordance with some embodiments.

FIG. 4 is a cross-sectional view of a semiconductor package structure 400 in accordance with some embodiments of the disclosure. It should be noted that the semiconductor package structure 400 may include the same or similar components as that of the semiconductor package structure 300 shown in FIG. 3, and for the sake of simplicity, those components will not be discussed in detail again. In the following embodiments, a capacitor is disposed over the backside redistribution layer 324.

As shown in FIG. 4, the first semiconductor die 312 includes a plurality of through vias 402, which are electrically coupled to the backside redistribution layer 324, in accordance with some embodiments. The through vias 402 may be similar to the through vias 314 as shown in FIG. 3, and will not be repeated.

As shown in FIG. 4, the first package structure 300a includes a capacitor 410 disposed over the backside redistribution layer 324, in accordance with some embodiments. The capacitor 320 may be disposed between the backside redistribution layer 324 and the second package structure 300b. As shown in FIG. 4, the capacitor 410 may have a plurality of terminals 410t, and may be electrically coupled to the first semiconductor die 312 through the terminals 410t, the backside redistribution layer 324, and the through vias 402 in the first semiconductor die 312.

In some other embodiments, the capacitor 410 is a multi-capacitor structure, such as the multi-terminal multi-capacitor structure 110 as shown in FIG. 1A, and the details will not be repeated. In these embodiments, the capacitor 410 may be electrically coupled to the first semiconductor die 312, and may also be electrically coupled to the second semiconductor die 306 through the terminals 410t, the backside redistribution layer 324, the through vias 402, and the through vias 308.

In the embodiments where the capacitor 310 is a multi-capacitor structure which is electrically coupled the first semiconductor die 312 and the second semiconductor die 306, the capacitor 410 may be omitted. Similarly, in the embodiments where the capacitor 410 is a multi-capacitor structure which is electrically coupled the first semiconductor die 312 and the second semiconductor die 306, the capacitor 310 may be replaced with the conductive terminals 304.

Alternatively, in some embodiments, at least one of the capacitor 310 and the capacitor 410 is a multi-capacitor structure, and the first package structure 300a may include more than two semiconductor dies which may be electrically coupled to the capacitor 310 and the capacitor 410.

In some embodiments, the capacitor 310 and the capacitor 320 in the semiconductor package structure 300 may be stacked vertically. Similarly, in some embodiments, the capacitor 310 and the capacitor 410 in the semiconductor package structure 400 may be stacked vertically. The stacked capacitors may be referred to as a multi-capacitor structure, and will be discussed in the description related to FIGS. 5A and 5B.

Figure 5A:
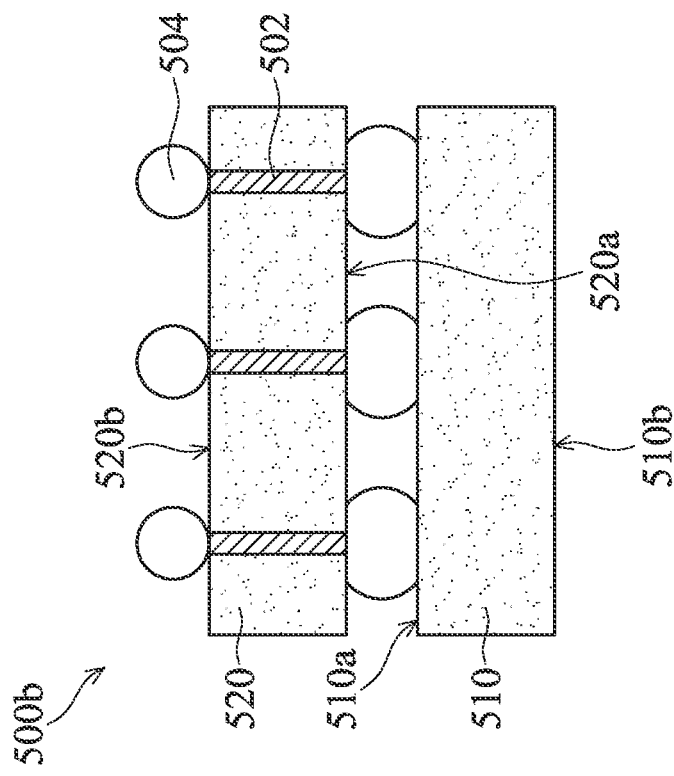
FIGS. 5A and 5B are cross-sectional views of a multi-capacitor structure of an exemplary semiconductor package structure in accordance with some embodiments.

FIG. 5A is a cross-sectional view of a multi-capacitor structure 500a of an exemplary semiconductor package structure in accordance with some embodiments. The multi-capacitor structure 500a in FIG. 5A may be disposed below the frontside redistribution layer 302, such as the position of the capacitor 310 as shown in FIG. 3, and may be electrically coupled to the frontside redistribution layer 302.

As shown in FIG. 5A, the multi-capacitor structure 500a includes a capacitor 510 and a capacitor 520 which are stacked vertically, in accordance with some embodiments. By using stacked capacitors instead of separate capacitors, the occupied space of the capacitors can be reduced, and this space may be used for active circuitry. Additionally, more conductive terminals 304 (as shown in FIG. 3) can be remained for interconnection. The capacitance can also be increased.

The capacitor 510 may have an active surface 510a and a backside surface 510b opposite to the active surface 510a, and the capacitor 520 may have an active surface 520a and a backside surface 520b opposite to the active surface 520a. In some embodiments, the capacitor 510 and the capacitor 520 are stacked face to back, as shown in FIG. 5A. That is, the active surface 510a of the capacitor 520 is close to the backside surface 520b of the capacitor 520.

As shown in FIG. 5A, the capacitor 520 includes a plurality of through vias 502 which are electrically coupled to the frontside redistribution layer 302 (as shown in FIG. 3), in accordance with some embodiments. The capacitor 510 below the capacitor 520 may be electrically coupled to the frontside redistribution layer 302 through the through vias 502. The through vias 502 may be formed of metal, such as copper, tungsten, the like, or a combination thereof.

As shown in FIG. 5A, the through vias 502 may have substantially vertical sidewalls and may extend from the active surface 520a of the capacitor 520 to the backside surface 520b of the capacitor 520, but the present disclosure is not limit thereto. The through vias 502 may have other configurations and numbers.

Figure 5B:
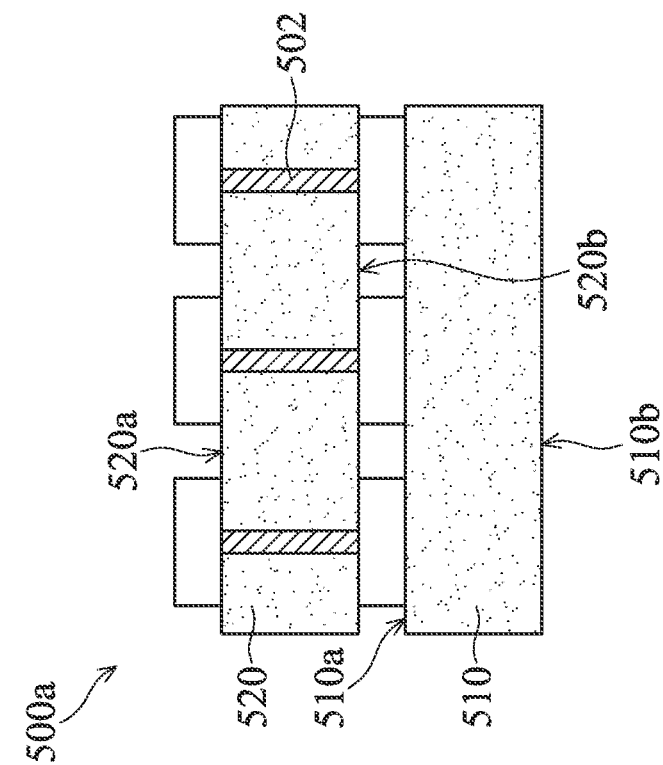

FIG. 5B is a cross-sectional view of a multi-capacitor structure 500b of an exemplary semiconductor package structure in accordance with some embodiments. It should be noted that the multi-capacitor structure 500b may include the same or similar components as that of the multi-capacitor structure 500a shown in FIG. 5A, and for the sake of simplicity, those components will not be discussed in detail again.

In some embodiments, the capacitor 510 and the capacitor 520 are stacked face to face, as shown in FIG. 5B. That is, the active surface 510a of the capacitor 520 is close to the active surface 520a of the capacitor 520. As shown in FIG. 5B, the multi-capacitor structure 500b may include a plurality of terminals 504 on the backside surface 520b of the capacitor 520. The terminals 504 may be disposed between the frontside redistribution layer 302 (as shown in FIG. 3) and the capacitor 520, and may electrically couple the frontside redistribution layer 302 to the capacitor 520.

Figure 6:
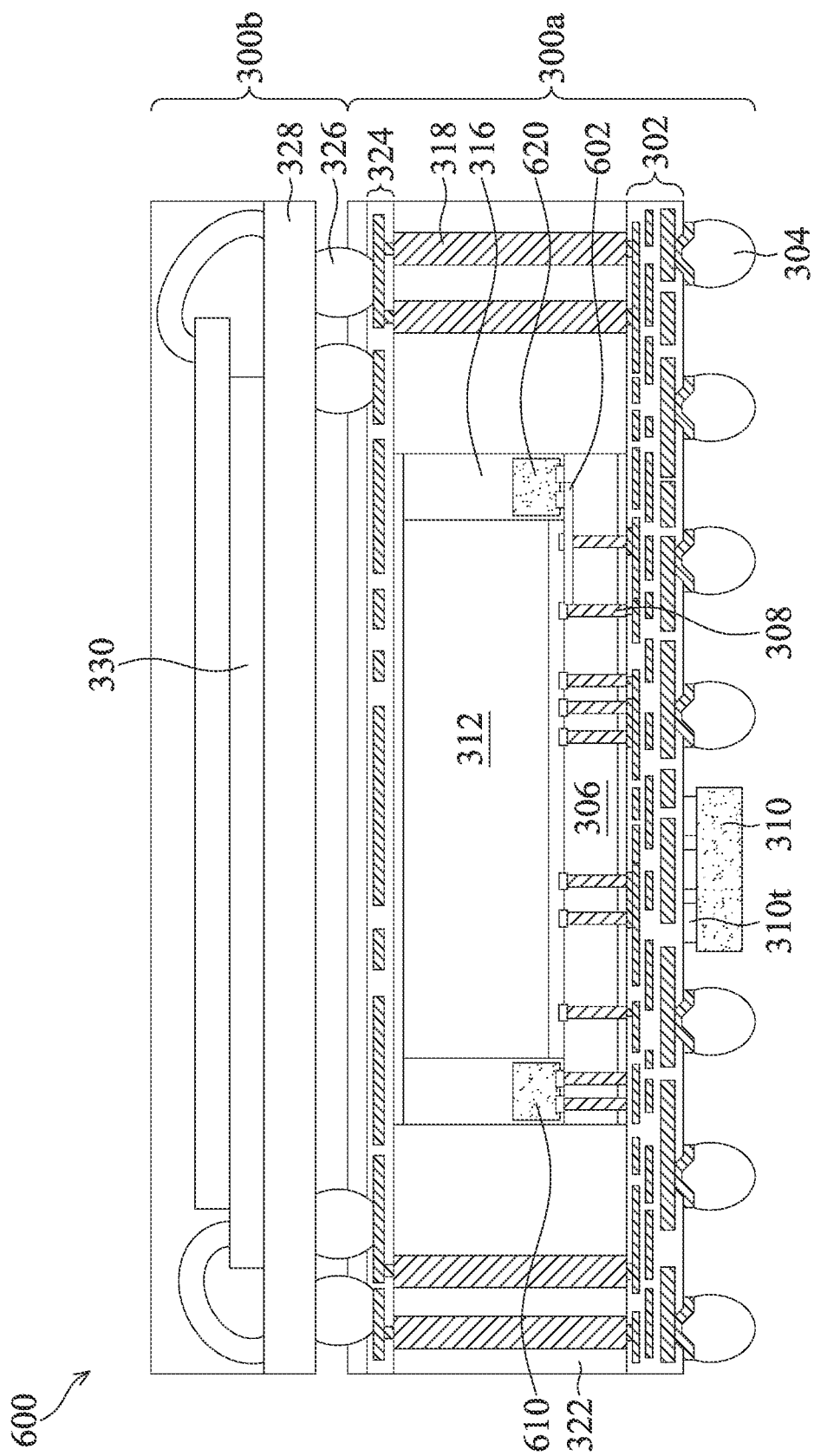
FIG. 6 is a cross-sectional view of an exemplary semiconductor package structure in accordance with some embodiments.

FIG. 6 is a cross-sectional view of a semiconductor package structure 600 in accordance with some embodiments of the disclosure. It should be noted that the semiconductor package structure 600 may include the same or similar components as that of the semiconductor package structure 300 shown in FIG. 3, and for the sake of simplicity, those components will not be discussed in detail again. In the following embodiments, a capacitor is disposed adjacent to the first semiconductor die 312.

As shown in FIG. 6, the semiconductor package structure 600 includes a capacitor 610 disposed over the second semiconductor die 306 and adjacent to the first semiconductor die 312, in accordance with some embodiments of the disclosure. The capacitor 610 may be electrically coupled to the second semiconductor die 306 through the through vias 308.

As shown in FIG. 6, the semiconductor package structure 600 includes a capacitor 620 disposed over the second semiconductor die 306 and adjacent to the first semiconductor die 312, in accordance with some embodiments of the disclosure. The semiconductor package structure 600 may include an interconnect structure 602 disposed over the second semiconductor die 306. In some embodiments, the interconnect structure 602 includes a redistribution layer.

As shown in FIG. 6, the interconnect structure 602 may extend between the first semiconductor die 312 and the second semiconductor die 306 and extend between the capacitor 620 and the second semiconductor die 306. The interconnect structure 602 may electrically couple the capacitor 620 to the first semiconductor die 312. In some embodiments, the interconnect structure 602 may be electrically coupled to the second semiconductor die 306 through the through vias 308.

The arrangement of the capacitor 310, the capacitor 610, and the capacitor 620 shown in the figures are exemplary only and are not intended to limit the present disclosure. For example, the capacitor 310 may be replaced with the conductive terminals 304. Alternatively, the capacitor 610 or the capacitor 620 may be omitted.

In some other embodiments, the capacitor 610 is a multi-capacitor structure, such as the multi-terminal multi-capacitor structure 110 as shown in FIG. 1A, and the details will not be repeated. In these embodiments, the capacitor 610 may be electrically coupled to the second semiconductor die 306, and may also be electrically coupled to the first semiconductor die 312 through the through vias 308 and the frontside redistribution layer 302.

In some other embodiments, the capacitor 620 is a multi-capacitor structure, such as the multi-terminal multi-capacitor structure 110 as shown in FIG. 1A, and the details will not be repeated. In these embodiments, the capacitor 620 may be electrically coupled to the first semiconductor die 312, and may also be electrically coupled to the second semiconductor die 306 through the interconnect structure 602 and the through vias 308.

Similarly, the capacitor 310 may be a multi-capacitor structure, and the details will not be repeated. In the embodiments where at least one of the capacitor 310, the capacitor 610, or the capacitor 620 is a multi-capacitor structure, the others of the capacitor 310, the capacitor 610, or the capacitor 620 may be omitted and/or may be replaced with the conductive terminals 304. Alternatively, the first package structure 300a may include more than two semiconductor dies which are electrically coupled to at least one of the capacitor 310, the capacitor 610, and the capacitor 620.

As shown in FIG. 6, the molding material 316 may surround the first semiconductor die 312, the capacitor 610, and the capacitor 620. The molding material 316 may cover the top surfaces of the capacitor 610 and the capacitor 620. The molding material 316 may protect the capacitor 610 and the capacitor 620 from the environment, thereby preventing these components from damage due to, for example, the stress, the chemicals and/or the moisture.

Figure 7:
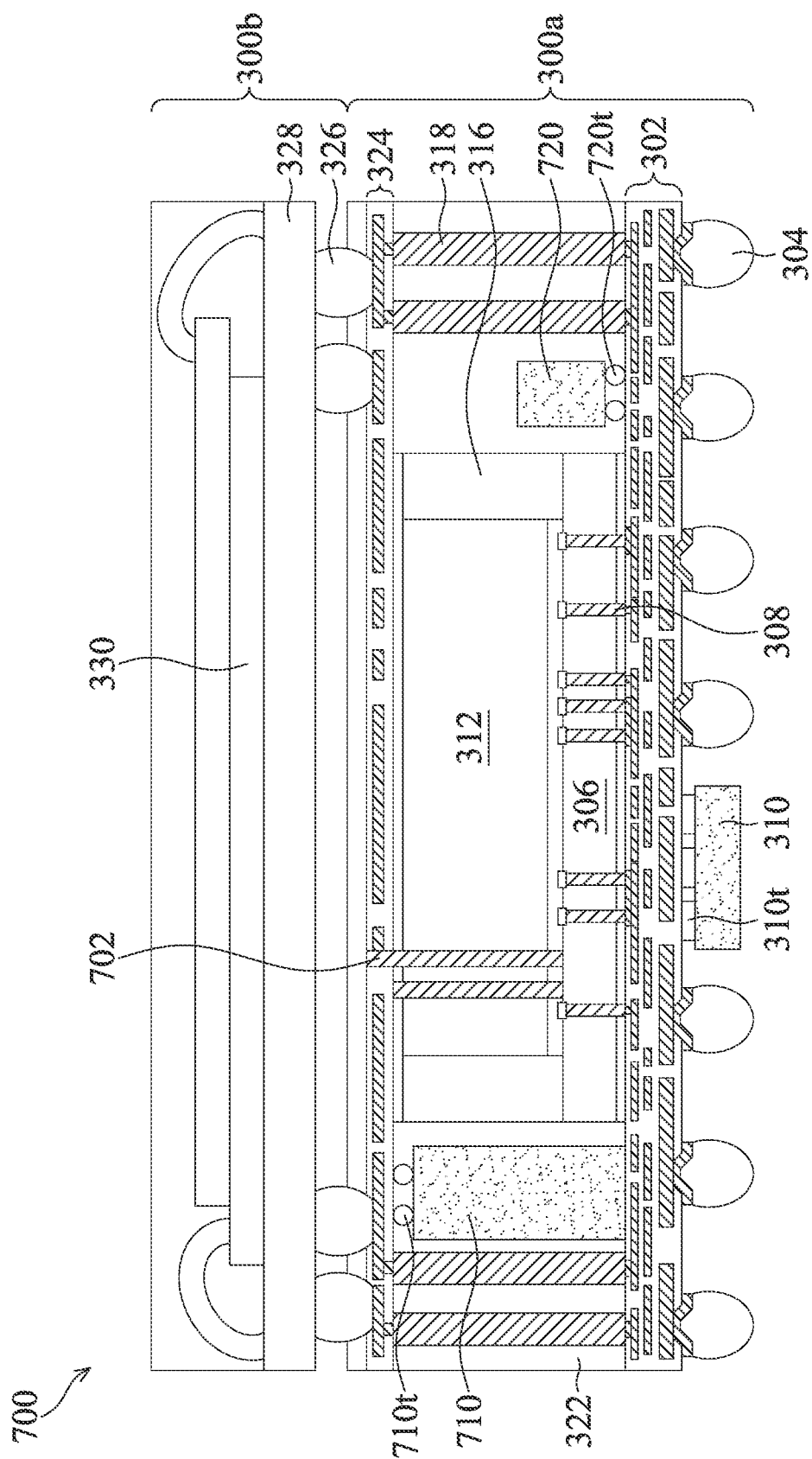
FIG. 7 is a cross-sectional view of an exemplary semiconductor package structure in accordance with some embodiments.

FIG. 7 is a cross-sectional view of a semiconductor package structure 700 in accordance with some embodiments of the disclosure. It should be noted that the semiconductor package structure 700 may include the same or similar components as that of the semiconductor package structure 300 shown in FIG. 3, and for the sake of simplicity, those components will not be discussed in detail again. In the following embodiments, a capacitor is disposed below the backside redistribution layer 324 and/or disposed over the frontside redistribution layer 302.

In some embodiments, the first semiconductor die 312 includes a plurality of through vias 702, which are electrically coupled to the backside redistribution layer 324. The through vias 702 may be similar to the through vias 314 as shown in FIG. 3, and will not be repeated.

As shown in FIG. 7, the semiconductor package structure 700 includes a capacitor 710 disposed below the backside redistribution layer 324 and surrounded by the molding material 322, in accordance with some embodiments. The capacitor 710 may be disposed between the conductive pillars 318 and the first semiconductor die 312.

As shown in FIG. 7, the capacitor 710 may be in contact with the frontside redistribution layer 302 and the backside redistribution layer 324. The capacitor 710 may have a plurality of terminals 710t, and may be electrically coupled to the first semiconductor die 312 through the terminals 710t, the backside redistribution layer 324, and the through vias 702.

As shown in FIG. 7, the semiconductor package structure 700 includes a capacitor 720 disposed over the frontside redistribution layer 302 and surrounded by the molding material 322, in accordance with some embodiments. The capacitor 720 may be disposed between the conductive pillars 318 and the second semiconductor die 306.

As shown in FIG. 7, the capacitor 720 may be in contact with the frontside redistribution layer 302 and spaced apart from the backside redistribution layer 324 by the molding material 322. The capacitor 720 may have a plurality of terminals 720t, and may be electrically coupled to the second semiconductor die 306 through the terminals 720t and the frontside redistribution layer 302.

The arrangement of the capacitor 310, the capacitor 710, and the capacitor 720 shown in the figures are exemplary only and are not intended to limit the present disclosure. For example, the capacitor 310 may be replaced with the conductive terminals 304. Alternatively, the capacitor 710 or the capacitor 720 may be omitted.

In some other embodiments, the capacitor 710 is a multi-capacitor structure, such as the multi-terminal multi-capacitor structure 110 as shown in FIG. 1A, and the details will not be repeated. In these embodiments, the capacitor 710 may be electrically coupled to the first semiconductor die 312, and may also be electrically coupled to the second semiconductor die 306 through the backside redistribution layer 324, the through vias 702, and the through vias 308.

In some other embodiments, the capacitor 720 is a multi-capacitor structure, such as the multi-terminal multi-capacitor structure 110 as shown in FIG. 1A, and the details will not be repeated. In these embodiments, the capacitor 720 may be electrically coupled to the second semiconductor die 306, and may also be electrically coupled to the first semiconductor die 312 through the frontside redistribution layer 302 and the through vias 308.

Similarly, the capacitor 310 may be a multi-capacitor structure, and the details will not be repeated. In the embodiments where at least one of the capacitor 310, the capacitor 710, or the capacitor 720 is a multi-capacitor structure, the others of the capacitor 310, the capacitor 710, or the capacitor 720 may be omitted and/or may be replaced with the conductive terminals 304. Alternatively, the first package structure 300a may include more than two semiconductor dies which are electrically coupled to at least one of the capacitor 310, the capacitor 710, and the capacitor 720.

Figure 8:
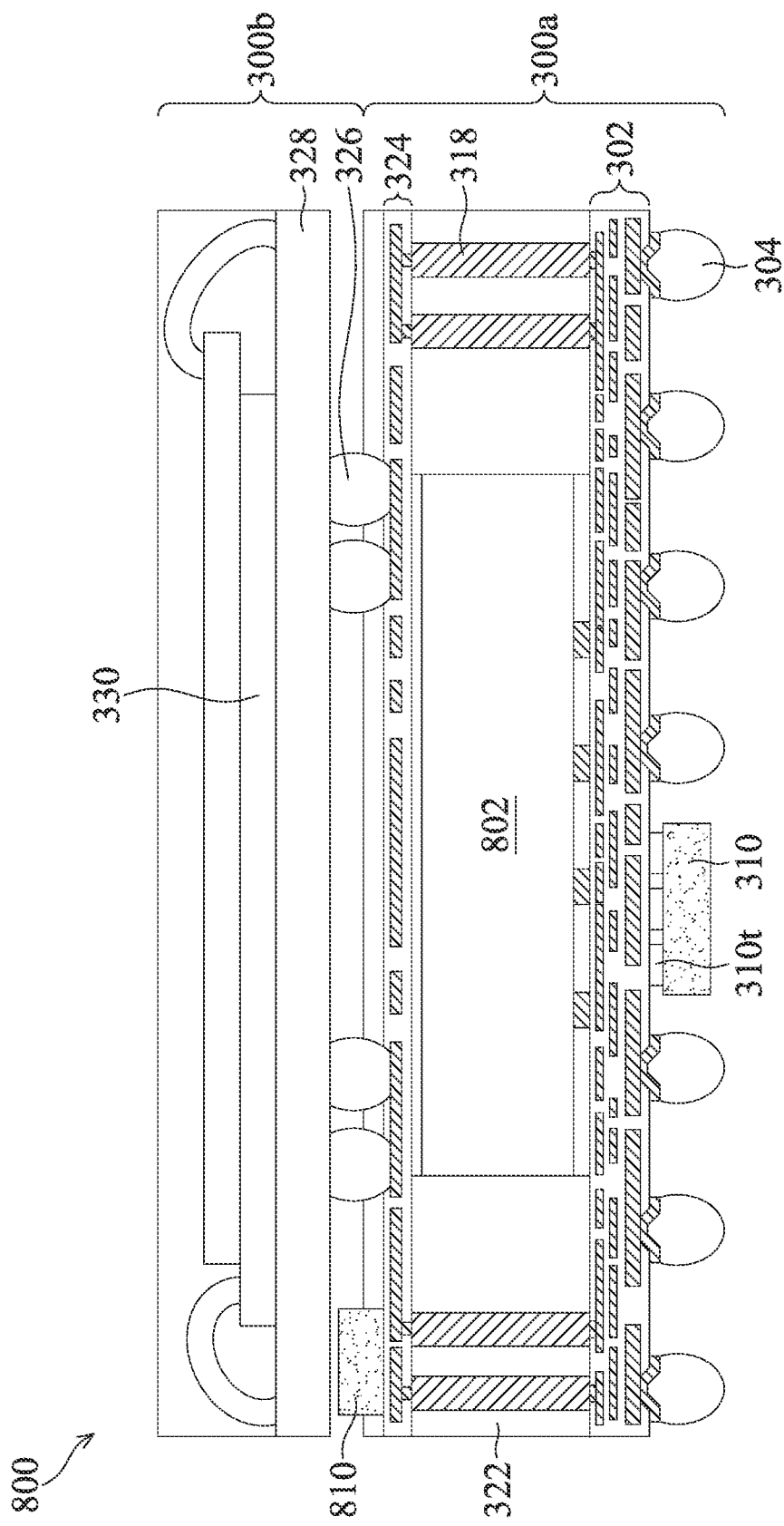
FIG. 8 is a cross-sectional view of an exemplary semiconductor package structure in accordance with some embodiments.

FIG. 8 is a cross-sectional view of a semiconductor package structure 800 in accordance with some embodiments of the disclosure. It should be noted that the semiconductor package structure 800 may include the same or similar components as that of the semiconductor package structure 300 shown in FIG. 3, and for the sake of simplicity, those components will not be discussed in detail again. In the following embodiments, a capacitor is disposed over the backside redistribution layer.

As shown in FIG. 8, the semiconductor package structure 800 includes a semiconductor die 802 disposed between the frontside redistribution layer 302 and the backside redistribution layer 324, in accordance with some embodiments. The semiconductor die 802 may be electrically coupled to the frontside redistribution layer 302. The semiconductor die 802 may be similar to the first semiconductor die 312 or the second semiconductor die 306 as shown in FIG. 3, and will not be repeated.

As shown in FIG. 8, the semiconductor package structure 800 includes a capacitor 810 disposed over the backside redistribution layer 324, in accordance with some embodiments. The capacitor 810 may be disposed directly above one of the conductive pillars 322. In some embodiments, the capacitor 810 may be electrically coupled to the semiconductor die 802 through the backside redistribution layer 324, the conductive pillars 322, and the frontside redistribution layer 302.

In some other embodiments, the capacitor 810 is a multi-capacitor structure, such as the multi-terminal multi-capacitor structure 110 as shown in FIG. 1A, and the details will not be repeated. In these embodiments, the capacitor 310 may be replaced with the conductive terminals 304. Alternatively, the first package structure 300a may include more than one semiconductor die electrically coupled to the capacitor 310 and/or the capacitor 810.

In comparison with the semiconductor package structure having a die-side capacitor, the semiconductor package structure 800 according to the present disclosure having the capacitor 810 disposed over the backside redistribution layer 324 can reduce the complexity of manufacturing, and improve the reliability of the semiconductor package structure 800.

Figure 9:
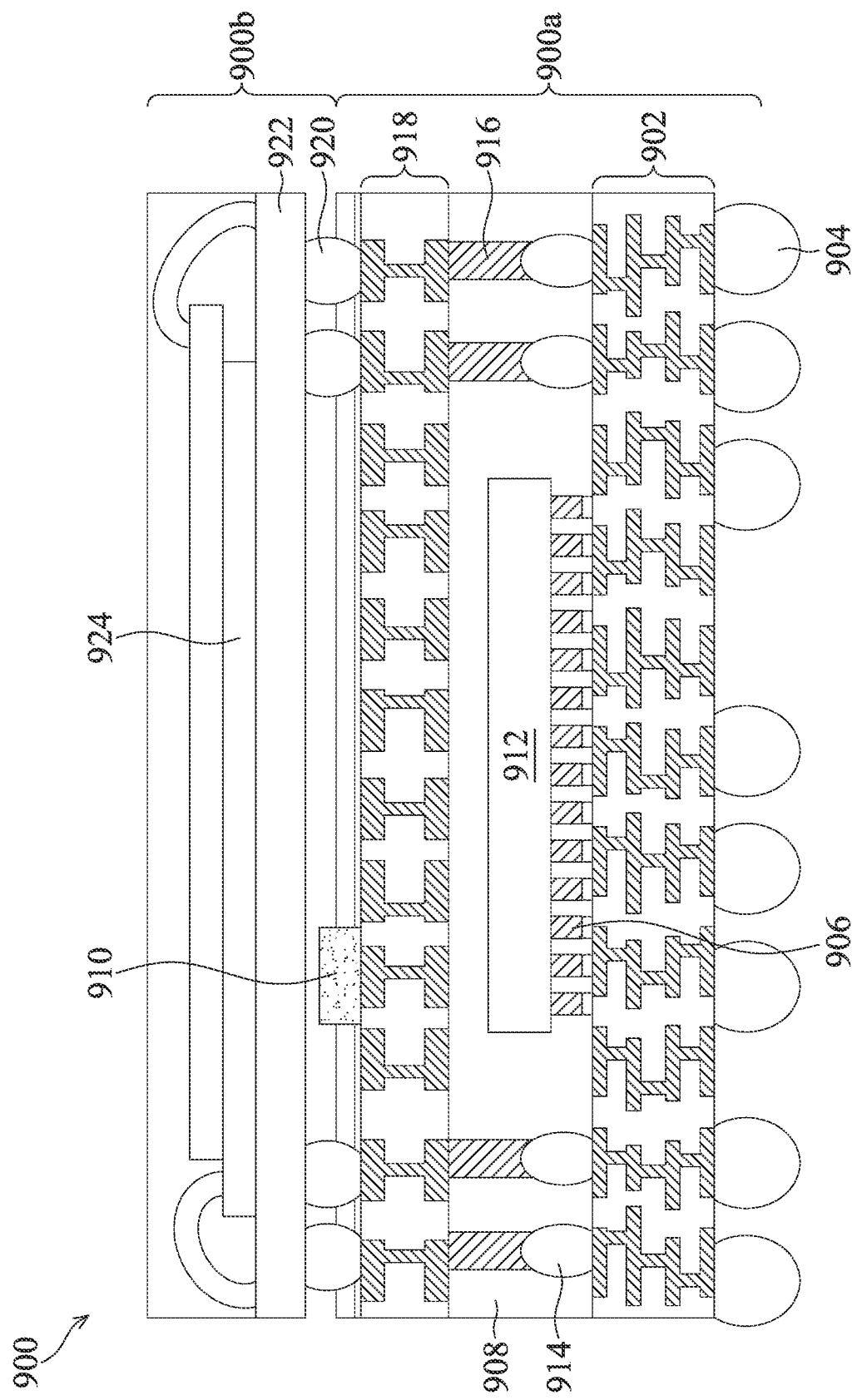
FIG. 9 is a cross-sectional view of an exemplary semiconductor package structure in accordance with some embodiments.

FIG. 9 is a cross-sectional view of a semiconductor package structure 900 in accordance with some embodiments of the disclosure. It should be noted that the semiconductor package structure 900 may include the same or similar components as that of the semiconductor package structure 300 shown in FIG. 3, and for the sake of simplicity, those components will not be discussed in detail again. In the following embodiments, a capacitor is disposed over an interposer.

As shown in FIG. 9, the semiconductor package structure 900 includes a first package structure 900a and a second package structure 900b stacked vertically, in accordance with some embodiments. As shown in FIG. 9, the first package structure 900a includes a substrate 902, in accordance with some embodiments. The substrate 902 may have a wiring structure therein. In some embodiments, the wiring structure in the substrate 902 includes conductive layers, conductive vias, conductive pillars, the like, or a combination thereof. The wiring structure in the substrate 902 may be formed of metal, such as copper, aluminum, the like, or a combination thereof.

The wiring structure in the substrate 902 may be disposed in inter-metal dielectric (IMD) layers. In some embodiments, the IMD layers may be formed of organic materials, such as a polymer base material, non-organic materials, such as silicon nitride, silicon oxide, silicon oxynitride, the like, or a combination thereof. The substrate 902 may include an insulating core, such as a fiberglass reinforced resin core, to prevent the substrate 902 from warpage.

It should be noted that the configuration of the substrate 902 shown in the figures is exemplary only and is not intended to limit the present disclosure. Any desired semiconductor element may be formed in and on the substrate 902. However, in order to simplify the diagram, only the flat substrate 902 is illustrated.

As shown in FIG. 9, the first package structure 900a includes a plurality of conductive terminals 904 disposed below the substrate 902 and electrically coupled to the wiring structure in the substrate 902, in accordance with some embodiments. The conductive terminals 904 may be similar to the conductive terminals 304 as shown in FIG. 3, and will not be repeated.

As shown in FIG. 9, the first package structure 900a includes a semiconductor die 912 disposed over the substrate 902, in accordance with some embodiments. The semiconductor die 912 may be similar to the first semiconductor die 312 or the second semiconductor die 306 as shown in FIG. 3, and will not be repeated.

The semiconductor die 912 may be electrically coupled to the wiring structure in the substrate 902 through a plurality of conductive structures 906. As shown in FIG. 9, the conductive structures 906 may be disposed between the substrate 902 and the semiconductor die 912. In some embodiments, the conductive structures 906 are formed of conductive materials, such as metal. The conductive structures 906 may include microbumps, controlled collapse chip connection (C4) bumps, solder balls, ball grid array (BGA) balls, the like, or a combination thereof.

As shown in FIG. 9, the first package structure 900a includes a plurality of bump structures 914 disposed over the substrate 902 and adjacent to the semiconductor die 912, in accordance with some embodiments. The bump structures 914 may be electrically coupled to the wiring structure in the substrate 902. The bump structures 914 may be formed of conductive materials, such as metal. In some embodiments, the bump structures 914 include solder balls.

As shown in FIG. 9, the bump structures 914 may be disposed on opposite sides of the semiconductor die 912. The configuration of the bump structures 914 shown in the figures is exemplary only and is not intended to limit the present disclosure.

As shown in FIG. 9, the first package structure 900a includes a plurality of conductive pillars 916 disposed directly above the bump structures 914, in accordance with some embodiments. The conductive pillars 916 may be electrically coupled to the wiring structure in the substrate 902 through the bump structures 914. The conductive pillars 916 may be formed of metal, such as copper, tungsten, the like, or a combination thereof.

As shown in FIG. 9, the first package structure 900a includes a molding material 908 surrounding the semiconductor die 912, the bump structures 914, and the conductive pillars 916, in accordance with some embodiments. The molding material 908 may adjoin the sidewalls of the semiconductor die 912, and may cover the top surface of the semiconductor die 912 and the top surface of the substrate 902.

As shown in FIG. 9, the molding material 908 may fill in gaps between the conductive pillars 916, and between the semiconductor die 912 and the conductive pillars 916. The molding material 908 may protect the semiconductor die 912, the bump structures 914, and the conductive pillars 916 from the environment, thereby preventing these components from damage due to, for example, the stress, the chemicals and/or the moisture.

In some embodiments, the molding material 908 includes a nonconductive material, such as a moldable polymer, an epoxy, a resin, the like, or a combination thereof. The molding material 908 may be similar to the molding material 322 as shown in FIG. 3, and will not be repeated.

As shown in FIG. 9, the first package structure 900a includes an interposer 918 disposed over the molding material 908, in accordance with some embodiments. The interposer 918 may have a wiring structure therein. The wiring structure in the interposer 918 may be electrically coupled to the substrate 902 through the conductive pillars 916 and the bump structures 914.

In some embodiments, the wiring structure in the interposer 918 includes conductive layers, conductive vias, conductive pillars, the like, or a combination thereof The wiring structure in the interposer 918 may be formed of metal, such as copper, aluminum, the like, or a combination thereof.

The wiring structure in the interposer 918 may be disposed in inter-metal dielectric (IMD) layers. In some embodiments, the IMD layers may be formed of organic materials, such as a polymer base material, non-organic materials, such as silicon nitride, silicon oxide, silicon oxynitride, the like, or a combination thereof.

It should be noted that the configuration of the interposer 918 shown in the figures is exemplary only and is not intended to limit the present disclosure. Any desired semiconductor element may be formed in and on the interposer 918. However, in order to simplify the diagram, only the flat interposer 918 is illustrated.

As shown in FIG. 9, the semiconductor package structure 900 includes a capacitor 910 disposed over the interposer 918, in accordance with some embodiments. The capacitor 910 may be electrically coupled to the semiconductor die 912 through the wiring structure in the interposer 918, the conductive pillars 916, the bump structures 914, the wiring structure in the substrate 902, and the conductive structures 906.

In some other embodiments, the capacitor 910 may be a multi-capacitor structure, such as the multi-terminal multi-capacitor structure 110 as shown in FIG. 1A, and the details will not be repeated. In these embodiments, the first package structure 900a may include more than one semiconductor die electrically coupled to the capacitor 910.

As shown in FIG. 9, the second package structure 900b is disposed over the first package structure 900a and is electrically coupled to the wiring structure in the interposer 918 through a plurality of conductive terminals 920, in accordance with some embodiments. The conductive terminals 920 may be similar to the conductive terminals 326 as shown in FIG. 3, and will not be repeated.

As shown in FIG. 9, the second package structure 900b includes a substrate 922 and semiconductor components 924 disposed over the substrate 922, in accordance with some embodiments. The substrate 922 and the semiconductor components 924 may be similar to the substrate 328 and the semiconductor components 330 as shown in FIG. 3, respectively, and will not be repeated.

In comparison with the semiconductor package structure having a die-side capacitor, the semiconductor package structure 900 according to the present disclosure having the capacitor 910 disposed over the interposer 918 can reduce the complexity of manufacturing.

Figure 10:
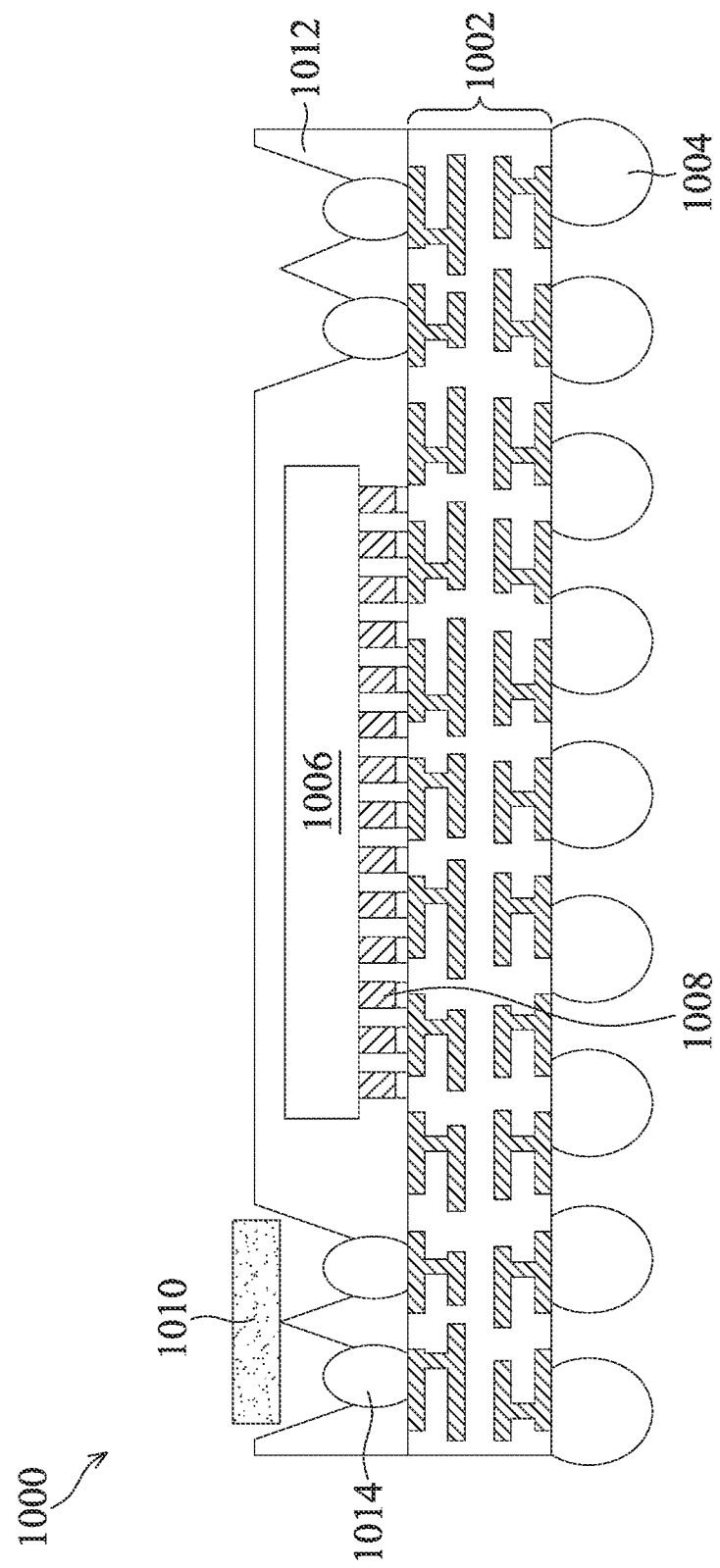
FIG. 10 is a cross-sectional view of an exemplary semiconductor package structure in accordance with some embodiments.

FIG. 10 is a cross-sectional view of a semiconductor package structure 1000 in accordance with some embodiments of the disclosure. It should be noted that the semiconductor package structure 1000 may include the same or similar components as that of the semiconductor package structure 900 shown in FIG. 9, and for the sake of simplicity, those components will not be discussed in detail again. In the following embodiments, a capacitor is disposed over a molding material.

As shown in FIG. 10, the semiconductor package structure 1000 includes a substrate 1002, in accordance with some embodiments. The substrate 1002 may have a wiring structure therein. The substrate 1002 may be similar to the substrate 902 as shown in FIG. 9, and will not be repeated.

As shown in FIG. 10, the semiconductor package structure 1000 includes a plurality of conductive terminals 1004 disposed below the substrate 1002 and electrically coupled to the wiring structure in the substrate 1002, in accordance with some embodiments. The conductive terminals 1004 may be similar to the conductive terminals 304 as shown in FIG. 3, and will not be repeated.

As shown in FIG. 10, the semiconductor package structure 1000 includes a semiconductor die 1006 disposed over the substrate 1002, in accordance with some embodiments. The semiconductor die 1006 may be similar to the first semiconductor die 312 or the second semiconductor die 306 as shown in FIG. 3, and will not be repeated.

The semiconductor die 1006 may be electrically coupled to the wiring structure in the substrate 1002 through a plurality of conductive structures 1008. As shown in FIG. 10, the conductive structures 1008 may be disposed between the substrate 1002 and the semiconductor die 1006. In some embodiments, the conductive structures 1008 are formed of conductive materials, such as metal. The conductive structures 1008 may include microbumps, controlled collapse chip connection (C4) bumps, solder balls, ball grid array (BGA) balls, the like, or a combination thereof.

As shown in FIG. 10, the semiconductor package structure 1000 includes a plurality of bump structures 1014 disposed over the substrate 1002 and adjacent to the semiconductor die 1006, in accordance with some embodiments. The bump structures 1014 may be electrically coupled to the wiring structure in the substrate 1002.

The bump structures 1014 may be formed of conductive materials, such as metal. In some embodiments, the bump structures 1014 include solder balls. As shown in FIG. 10, the bump structures 1014 may be disposed on opposite sides of the semiconductor die 912. The configuration of the bump structures 1014 shown in the figures is exemplary only and is not intended to limit the present disclosure.

As shown in FIG. 10, the semiconductor package structure 1000 includes a molding material 1012 surrounding the semiconductor die 1006 and the bump structures 1014, in accordance with some embodiments. As shown in FIG. 10, the molding material 1012 may adjoin the sidewalls of the semiconductor die 1006, and may cover the top surface of the semiconductor die 1006 and the top surface of the substrate 1002.

The molding material 1012 may protect the semiconductor die 1006 and the bump structures 1014 from the environment, thereby preventing these components from damage due to, for example, the stress, the chemicals and/or the moisture. The molding material 908 may be similar to the molding material 322 as shown in FIG. 3, and will not be repeated.

In some embodiments, the molding material 1012 includes a nonconductive material, such as a moldable polymer, an epoxy, a resin, the like, or a combination thereof. The molding material 1012 may be similar to the molding material 322 as shown in FIG. 3, and will not be repeated.

As shown in FIG. 10, the molding material 1012 has an opening to expose the upper portion of the bump structures 1014, in accordance with some embodiments. The opening of the molding material 1012 may be formed by a laser ablation method or any other suitable method. In the laser ablation method, a portion of the molding material 1012 may be removed when irradiated with a laser beam.

The semiconductor package structure 1000 may include a capacitor 1010 disposed in the opening of the molding material 1012. The capacitor 1010 may be electrically coupled to the semiconductor die 1006 through the bump structures 1014, the wiring structure in the substrate 1002, and the conductive structures 1008.

In some other embodiments, the capacitor 1010 may be a multi-capacitor structure, such as the multi-terminal multi-capacitor structure 110 as shown in FIG. 1A, and the details will not be repeated. In these embodiments, the semiconductor package structure 1000 may include more than one semiconductor die electrically coupled to the capacitor 1010.

In comparison with the semiconductor package structure having a die-side capacitor, the semiconductor package structure 1000 according to the present disclosure having the capacitor 910 disposed over the molding material 1012 can reduce the complexity of manufacturing.

In summary, in some embodiments, the semiconductor package structure according to the present disclosure adopts a multi-terminal multi-capacitor structure to reduce the space occupied, so that more conductive terminals can be remained than using separate capacitors for different semiconductor dies. Design flexibility can also be improved.

Furthermore, in some embodiments, at least one capacitor is disposed without occupying the space of the conductive terminals, such as disposed over the frontside redistribution layer. As a result, more conductive terminals which are disposed below the frontside redistribution layer can be reserved for interconnection, and the design flexibility can be increased.

Moreover, in some embodiments, at least one capacitor is disposed over a molding material. In comparison with a die-side capacitor, the capacitor according to these embodiments of the present disclosure can reduce the complexity of manufacturing and the cost. The reliability of the semiconductor package structure can also be improved.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a frontside redistribution layer;
   a first semiconductor die disposed over the frontside redistribution layer;
   a first capacitor disposed over the frontside redistribution layer and electrically coupled to the first semiconductor die;
   a conductive terminal disposed below the frontside redistribution layer and electrically coupled to the frontside redistribution layer; and
   a backside redistribution layer disposed over the first semiconductor die,
   wherein the first capacitor is a multi-terminal multi-capacitor structure and is electrically coupled to a second semiconductor die adjacent to the first semiconductor die.

2. The semiconductor package structure as claimed in claim 1, wherein the first capacitor is disposed below the backside redistribution layer and electrically coupled to the first semiconductor die through the backside redistribution layer and a through via in the first semiconductor die.

3. The semiconductor package structure as claimed in claim 2, further comprising a molding material disposed between the frontside redistribution layer and the backside redistribution layer and surrounding the first capacitor and the first semiconductor die.

4. The semiconductor package structure as claimed in claim 3, wherein the first capacitor is in contact with the backside redistribution layer and spaced apart from the frontside redistribution layer by the molding material.

5. The semiconductor package structure as claimed in claim 3, wherein the first capacitor is in contact with the frontside redistribution layer and the backside redistribution layer.

6. The semiconductor package structure as claimed in claim 5, further comprising:
   a third semiconductor die disposed over the frontside redistribution layer; and a second capacitor disposed over the frontside redistribution layer and electrically coupled to the third semiconductor die through the frontside redistribution layer.

7. The semiconductor package structure as claimed in claim 1, further comprising a third semiconductor die disposed between the frontside redistribution layer and the first semiconductor die,
wherein the first capacitor is disposed over the frontside redistribution layer and electrically coupled to the first semiconductor die through the frontside redistribution layer and a through via in the third semiconductor die.

8. The semiconductor package structure as claimed in claim 1, wherein the first capacitor is disposed over the backside redistribution layer and electrically coupled to the first semiconductor die through the backside redistribution layer and a through via in the first semiconductor die.

9. The semiconductor package structure as claimed in claim 1, further comprising:
a third semiconductor die disposed over the frontside redistribution layer, wherein the first semiconductor die and the first capacitor are disposed over the third semiconductor die; and
an interconnect structure disposed over the third semiconductor die and electrically coupling the first capacitor to the first semiconductor die.

10. The semiconductor package structure as claimed in claim 9, further comprising a second capacitor disposed over the third semiconductor die and electrically coupled to the third semiconductor die through a through via in the third semiconductor die.

11. The semiconductor package structure as claimed in claim 1, further comprising a conductive pillar adjacent to the first semiconductor die, wherein the first capacitor is disposed over the backside redistribution layer and electrically coupled to the first semiconductor die through the backside redistribution layer, the conductive pillar and the frontside redistribution layer.

12. The semiconductor package structure as claimed in claim 1, further comprising:
a third semiconductor die disposed over the frontside redistribution layer; and
a second capacitor disposed below the frontside redistribution layer and electrically coupled to the third semiconductor die through the frontside redistribution layer.

13. The semiconductor package structure as claimed in claim 12, further comprising a third capacitor disposed below the second capacitor and electrically coupled to the frontside redistribution layer through a through via in the second capacitor.

14. A semiconductor package structure, comprising:
a substrate having a wiring structure;
a semiconductor die disposed over the substrate and electrically coupled to the wiring structure;
a bump structure adjacent to the semiconductor die;
a molding material surrounding the semiconductor die and the bump structure; and
a capacitor disposed over the molding material and electrically coupled to the semiconductor die through the bump structure and the wiring structure,
wherein the capacitor is a multi-terminal multi-capacitor structure and is electrically coupled to another semiconductor die which is disposed in the molding material.

15. The semiconductor package structure as claimed in claim 14, wherein the molding material has an opening to expose an upper portion of the bump structure.

16. The semiconductor package structure as claimed in claim 14, further comprising:
a conductive pillar disposed over the bump structure and surrounded by the molding material; and
an interposer disposed over the molding material, wherein the capacitor is electrically coupled to the semiconductor die through the interposer, the conductive pillar, the bump structure, and the wiring structure.

17. A semiconductor package structure, comprising:
a redistribution layer;
a multi-capacitor structure disposed below the redistribution layer;
a bottom semiconductor die disposed over the redistribution layer and having a through via, wherein the bottom semiconductor die is electrically coupled to the multi-capacitor structure through the redistribution layer; and
a top semiconductor die disposed over the bottom semiconductor die and electrically coupled to the multi-capacitor structure through the through via and the redistribution layer,
wherein the multi-capacitor structure comprises a first capacitor and a second capacitor stacked vertically, and the second capacitor has a through via to electrically couple the first capacitor to the redistribution layer.

18. The semiconductor package structure as claimed in claim 17, wherein the multi-capacitor structure is a multi-terminal multi-capacitor structure which comprises multi terminals to electrically couple to ground and power terminals of the top semiconductor die and the bottom semiconductor die.

19. The semiconductor package structure as claimed in claim 18, further comprising a substrate between the redistribution layer and the capacitor structure, wherein the substrate has a wiring structure which electrically couples the multi-capacitor structure to the redistribution layer.

* * * * *